(12) United States Patent
Shunichi et al.

(10) Patent No.: US 7,618,556 B2
(45) Date of Patent: Nov. 17, 2009

(54) PHOSPHOR FOR WHITE LIGHT-EMITTING DEVICE AND WHITE LIGHT-EMITTING DEVICE INCLUDING THE SAME

(75) Inventors: Kubota Shunichi, Yongin-si (KR); Young-sic Kim, Yongin-si (KR); Seoung-jae Im, Yongin-si (KR)

(73) Assignee: Samsung Electro-mechanics Co., Ltd. (KR)

( * ) Notice: Subject to any disclaimer, the term of this patent is extended or adjusted under 35 U.S.C. 154(b) by 249 days.

(21) Appl. No.: 11/688,034

(22) Filed: Mar. 19, 2007

(65) Prior Publication Data
US 2008/0020236 A1    Jan. 24, 2008

(30) Foreign Application Priority Data
Jul. 21, 2006   (KR) ................. 10-2006-0068509

(51) Int. Cl.
*C09K 11/55* (2006.01)
*C09K 11/59* (2006.01)
*C09K 11/66* (2006.01)
(52) U.S. Cl. ............... 252/301.4 F; 257/98; 313/503
(58) Field of Classification Search .......... 252/301.4 F; 257/98; 313/503
See application file for complete search history.

(56) References Cited

U.S. PATENT DOCUMENTS

2007/0200095 A1*   8/2007   Murazaki ............. 252/301.4 H

* cited by examiner

*Primary Examiner*—C. Melissa Koslow
(74) *Attorney, Agent, or Firm*—Cantor Colburn LLP

(57) ABSTRACT

Provided are an alkaline earth metal silicate-based phosphor which is a compound represented by Formula 1 below, and a white light-emitting device (LED) including the same.

$$(M1_{1-x-y}A_xB_y)_aMg_bM2_cO_dZ_e \qquad \text{Formula 1}$$

wherein,
M1 is one selected from the group consisting of Ba, Ca, and Sr;
M2 is at least one selected from Si or Ge;
A and B are each independently one selected from the group consisting of Eu, Ce, Mn, Pr, Nd, Sm, Gd, Tb, Dy, Ho, Er, Tm, Yb, Bi, Sn, and Sb;
Z is at least one selected from the group consisting of a monovalent or divalent element, H, and N; and
$0<x<1$, $0\leq y\leq 1$, $6.3<a<7.7$, $0.9<b<1.1$, $3.6<c<4.4$, $14.4<d<17.6$, $14.4<d+e<17.6$, and $0\leq e\leq 0.18$.

The alkaline earth metal silicate-based phosphor has a broad excitation wavelength range, and thus, both a UV-LED and a blue LED can be used as excitation sources for white LEDs. Furthermore, the total emission area of an emission spectrum of the alkaline earth metal silicate-based phosphor is greater than that of a common phosphor, thereby achieving better emission efficiency.

15 Claims, 8 Drawing Sheets

PHOSPHOR FOR WHITE LIGHT-EMITTING DEVICE AND WHITE LIGHT-EMITTING DEVICE INCLUDING THE SAME

This application claims priority to Korean Patent Application No. 10-2006-0068509, filed on Jul. 21, 2006, and all the benefits accruing therefrom under 35 U.S.C. §119, the content of which is incorporated herein by reference in its entirety.

BACKGROUND OF THE INVENTION

1. Field of the Invention

The present invention relates to an alkaline earth metal silicate-based phosphor and a white light-emitting device including the same. More particularly, the present invention relates to an alkaline earth metal silicate-based phosphor having a broad excitation wavelength range, an emission spectrum over a broad wavelength range, and good emission efficiency, and a white light-emitting device including the same.

2. Description of the Related Art

Semiconductor-based white light-emitting devices ("white LEDs") have advantages of a longer lifetime, a smaller size, and a lower driving voltage than incandescent lamps, and thus, have been considered as potential substitutes for conventional light sources in all aspects of the illumination field, including fluorescent lamps, backlights of liquid crystal displays, and the like.

White LEDs can produce white light by combining red, green, and blue LEDs emitting light of the three primary colors, red, green, and blue, exciting a yellow phosphor using a blue LED as a light source, or exciting red, green, and blue phosphors using a UV LED as a light source.

In the manufacture of white LEDs as described above, generally, $K_5Eu_{2.5}(WO_4)_{6.25}$, $La_2O_2S$:Eu, or the like can be used as a red phosphor, $(Ba,Sr)_2SiO_4$:Eu or the like can be used as a green phosphor, and $Sr_5(PO_4)_3Cl$:Eu or the like can be used as a blue phosphor.

White LEDs producing white light by exciting red, green, and blue phosphors using a UV LED as a light source can be used under high current and can produce good white light, and thus, have attracted the most research interest. White LEDs producing white light by exciting a green phosphor, e.g., ZnS:Cu,Al, $BaMgAl_{10}O_{17}$:Eu,Mn (e.g., from Mitsubishi Chemical), and the like, using a UV-LED as a light source have been applied to cathode ray tubes ("CRTs"), illuminators, and the like. However, conventional phosphors exhibit low emission efficiency due to poor solidification, and have a narrow emission peak wavelength range, and thus, it is difficult to produce a spectrum of light similar to natural light.

BRIEF SUMMARY OF THE INVENTION

In an embodiment, an alkaline earth metal silicate-based phosphor is provided which has good emission efficiency and a broad emission peak wavelength range under a UV excitation source.

In another embodiment, a white LED including the phosphor, which is excellent in emission efficiency and has a natural light rendering property.

According to an embodiment, there is provided an alkaline earth metal silicate-based phosphor comprising a compound represented by Formula 1 below:

$$(M1_{1-x-y}A_xB_y)_aMg_bM2_cO_dZ_e$$  Formula 1 wherein,

M1 is one selected from the group consisting of Ba, Ca, and Sr;

M2 is at least one selected from Si or Ge;

A and B are each independently one selected from the group consisting of Eu, Ce, Mn, Pr, Nd, Sm, Gd, Tb, Dy, Ho, Er, Tm, Yb, Bi, Sn, and Sb;

Z is at least one selected from the group consisting of a monovalent or divalent atom, H, and N; and $0 < x < 1$, $0 \leq y \leq 1$, $6.3 < a < 7.7$, $0.9 < b < 1.1$, $3.6 < c < 4.4$, $14.4 < d < 17.6$, $14.4 < d+e < 17.6$, and $0 \leq e \leq 0.18$.

According to another embodiment, there is provided a white LED including: a UV LED; and the above-described alkaline earth metal silicate-based phosphor.

The emission wavelength of the UV LED may be 390 to 460 nm. The LED may further include at least one selected from a blue phosphor or a red phosphor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
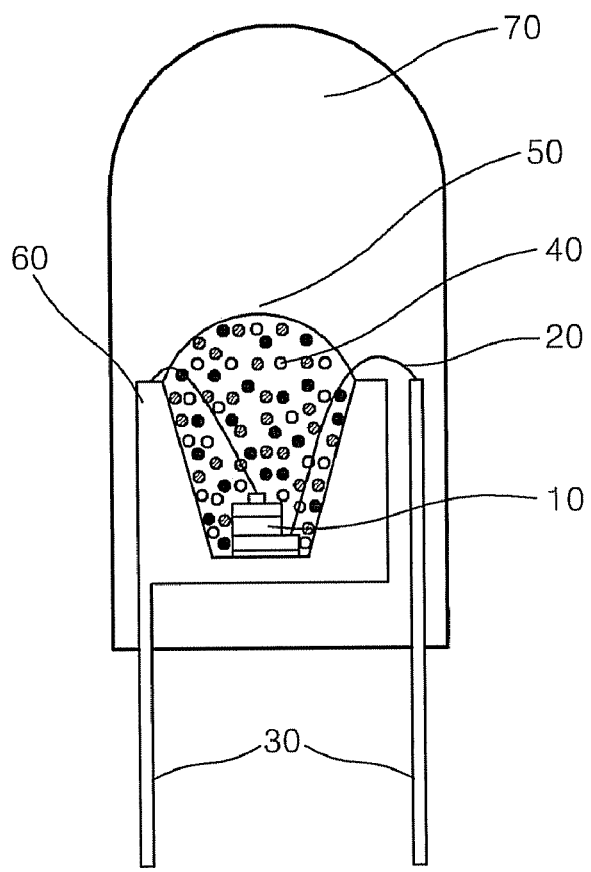
FIG. 1 is a schematic view illustrating the structure of an exemplary white LED according to an embodiment.

The present invention will now be described more fully with reference to the accompanying drawings, in which exemplary embodiments of the invention are shown.

It will be understood that when an element is referred to as being "on" another element, it can be directly on the other element or intervening elements may be present therebetween. In contrast, when an element is referred to as being "disposed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The present invention provides an alkaline earth metal silicate-based phosphor comprising a compound represented by Formula 1 below.

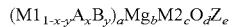   Formula 1 wherein,

M1 is one selected from the group consisting of Ba, Ca, and Sr;

M2 is at least one selected from Si or Ge;

A and B are each independently one selected from the group consisting of Eu, Ce, Mn, Pr, Nd, Sm, Gd, Tb, Dy, Ho, Er, Tm, Yb, Bi, Sn, and Sb;

Z is at least one selected from the group consisting of a monovalent or divalent atom, H, and N; and $0<x<1$, $0\leq y\leq 1$, $6.3<a<7.7$, $0.9<b<1.1$, $3.6<c<4.4$, $14.4<d<17.6$, $14.4<d+e<17.6$, and $0\leq e\leq 0.18$.

The phosphor has a broad excitation wavelength range, and thus, both a UV-LED and a blue LED can be used as excitation sources for white LEDs. Furthermore, the total emission area of an emission spectrum of the phosphor is greater than that obtained from a conventional phosphor, thereby providing improved emission efficiency. The compound of Formula 1 of the present invention has a bredigite structure. The compound having the bredigite structure according to the present invention includes several alkaline earth metal sites of different crystal fields. The alkaline earth metal sites can be partially or wholly substituted by a dopant such as Eu, Ce, Mn, Pr, Nd, Sm, Gd, Tb, Dy, Ho, Er, Tm, Yb, Bi, Sn, or Sb, thereby providing a broad excitation wavelength range and a broad emission spectrum.

The compound having the bredigite structure having the above-described characteristics can be effectively used as a phosphor, and in particular, is suitable for white LEDs for illumination. In addition, the compound having the bredigite structure has a broad excitation wavelength range, and thus, both a UV-LED and/or a blue LED can be used as excitation sources.

The phosphor of Formula 1 exhibits an absorption spectrum at an excitation wavelength range of 390-460 nm and good emission efficiency at an emission peak wavelength range of 500-550 nm.

As described above, the phosphor of Formula 1 according to the present invention is doped with an alkaline earth metal and at least one metal ion selected from the group consisting of Eu, Ce, Mn, Pr, Nd, Sm, Gd, Tb, Dy, Ho, Er, Tm, Yb, Bi, Sn, and Sb. These ions can absorb strong UV light according to a phosphor host lattice of a bredigite structure, and can produce light of various colors.

Figure 3:
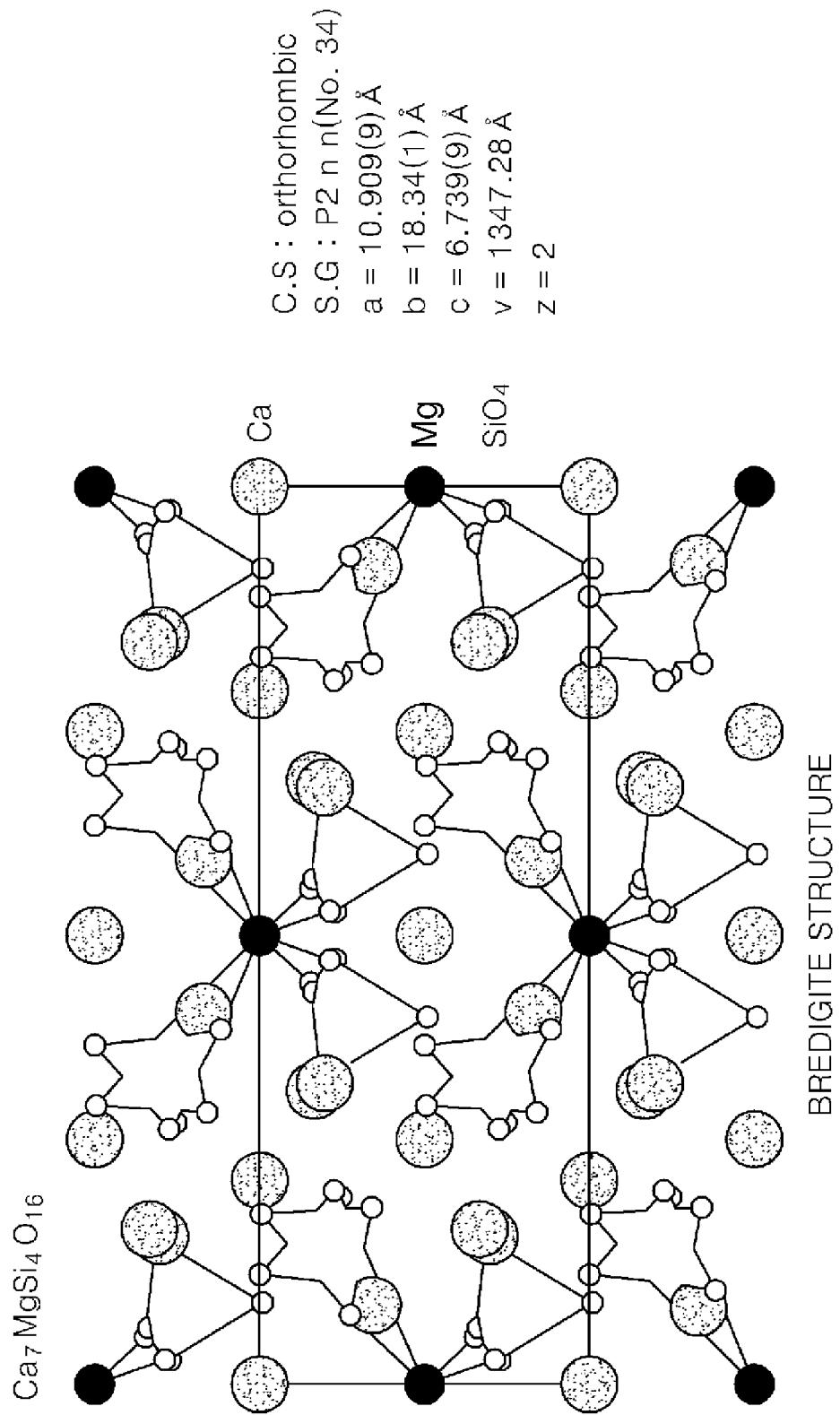
FIG. 3 illustrates the crystal structure of an exemplary $Ca_7MgSi_4O_{16}$ phosphor according to an embodiment.

The compound of Formula 1 of the present invention has a characteristic crystal structure. FIG. 3 illustrates the bredigite crystal structure of $Ca_7MgSi_4O_{16}$ which is a compound of Formula 1. In Formula 1, M1 occupies eight sites of a unit cell in an orthorhombic crystal structure (C.S. in FIG. 3; also, S.G. is the space group a, b, c are unit cell dimensions in angstroms Å, and v is the unit cell volume in $Å^3$). M1 in each of the eight sites can be substituted by Eu, Mn, or the like so that the compound of Formula 1 can be used as a phosphor. The eight sites have different crystal fields. Thus, excitation sources required for exciting activators (e.g., Eu and Mn) substituting for M1 in the eight sites have different excitation wavelengths, thereby producing an emission spectrum with a broad wavelength range. Due to the above-described characteristics, the compound of the present invention can be used effectively as a phosphor to produce a spectrum of light similar to natural (i.e., white) light.

Figure 2A:
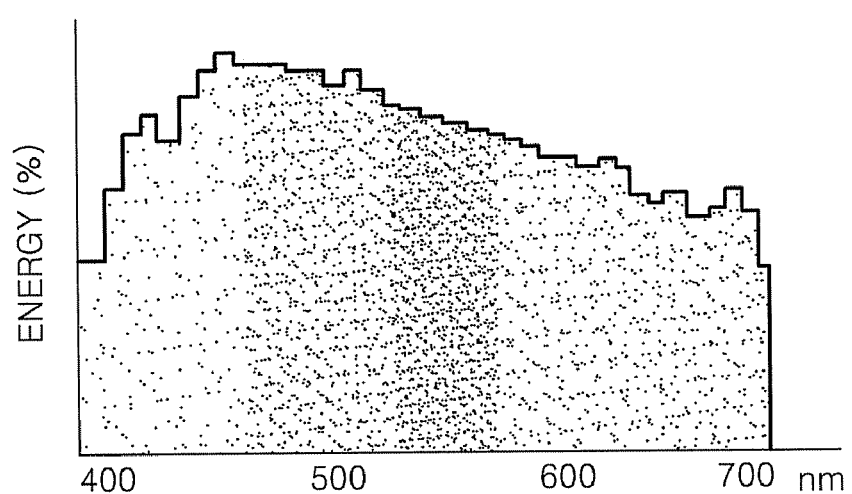
FIG. 2A illustrates energy intensity with respect to the wavelength of natural light.
Figure 2B:
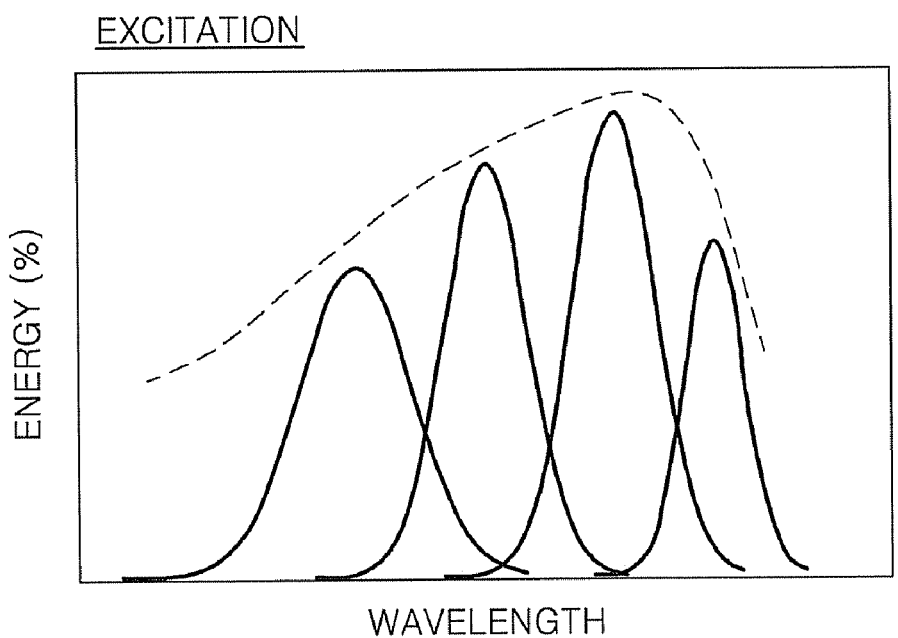
FIGS. 2B and 2C are schematic views respectively illustrating an excitation wavelength range and an emission wavelength range of an exemplary compound according to an embodiment.
Figure 2C:
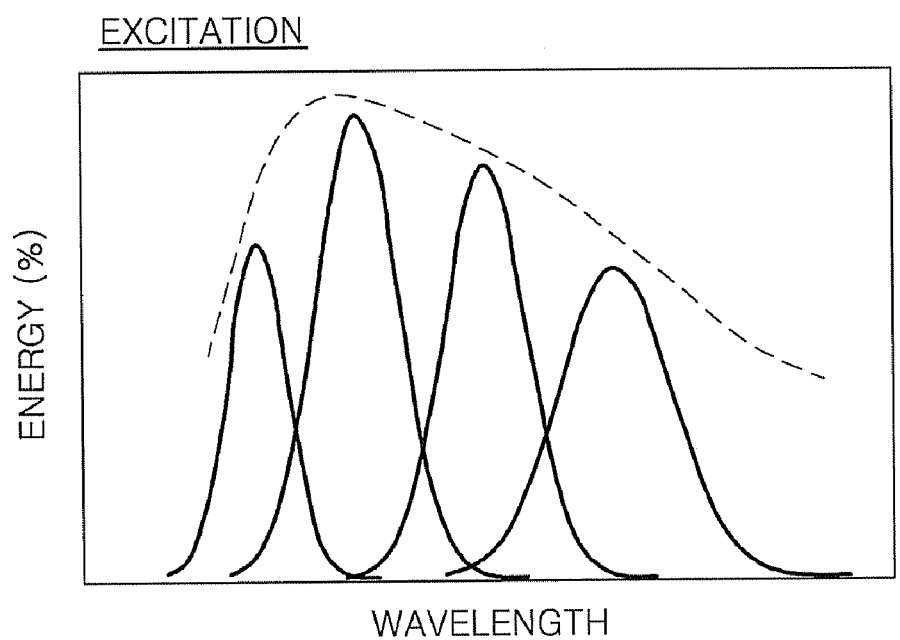

FIG. 2A illustrates an energy intensity with respect to the wavelength of natural light, and FIGS. 2B and 2C are schematic graphs respectively illustrating an excitation wavelength range and an emission wavelength range of a compound according to the present invention. Conventional red, green, and blue phosphors can achieve strong emission in narrow wavelength ranges corresponding to respective colors. However, referring to FIG. 2C, emission energy with respect to wavelength for a compound according to the present invention exhibits an energy distribution that is very similar to the energy distribution of natural light (i.e., the energy distribution shown in FIG. 2A).

In particular, the alkaline earth metal silicate-based phosphor of Formula 1 of the present invention may be a phosphor represented by Formula 2 below:

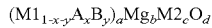   Formula 2 wherein,

M1 is one selected from the group consisting of Ba, Ca, and Sr;

M2 is at least one selected from Si or Ge;

A and B are each independently one selected from the group consisting of Eu, Ce, Mn, Pr, Nd, Sm, Gd, Tb, Dy, Ho, Er, Tm, Yb, Bi, Sn, and Sb; and $0<x<1$, $0\leq y\leq 1$, $6.3<a<7.7$, $0.9<b<1.1$, $3.6<c<4.4$, and $14.4<d<17.6$.

Examples of the phosphor of Formula 2 include $(Ca_{0.99}Eu_{0.01})_7MgSi_4O_{16}$ (also represented by $Ca_7MgSi_4O_{16}$:Eu), $(Ca_{0.96}Eu_{0.01}Mn_{0.03})_7MgSi_4O_{16}$ (also represented by $Ca_7MgSi_4O_{16}$:Eu,Mn), and $(Ca_{0.99}Ca_{0.01})_7MgSi_4O_{16}$.

A method of preparing the phosphor of Formula 1 is not particularly limited, but may be performed using a solid phase process, a liquid phase process, or a vapor phase process. A method of preparing the phosphor of Formula 1 using a solid phase process is as follows.

Hereinafter, a method of preparing $(Ca,Sr,Ba)_7Mg(Si_4O_{16})$:Eu,Mn according to an embodiment will be described. Specifically, in an embodiment, a method of preparing a $Ca_7MgSi_4O_{16}$:Eu,Mn will be described.

At least one selected from a calcium-containing compound; a magnesium-containing compound; a europium-containing compound; a manganese-containing compound; and a silicon-containing compound, are mixed in the desired stoichiometric amounts. In an embodiment, a strontium containing compound or a barium-containing compound may be substituted for the calcium-containing compound. The resultant mixture is pulverized if required, dried, and primarily sintered at 800 to 1,300° C.

Next, the primarily sintered product is secondarily sintered in a mixed gas atmosphere of hydrogen and nitrogen at 1,000 to 1,500° C. At this time, the content of the hydrogen in the mixed gas atmosphere is adjusted to at least 5 volume % based on the total volume of hydrogen and nitrogen.

In the two-step sintering process, the primary sintering serves to remove impurities contained in a material mixture, e.g., moisture, organic materials, or complexes of some salts, and to promote crystal growth. If the primary sintering temperature is less than 800° C., insufficient crystallization can occur. On the other hand, if the primary sintering temperature exceeds 1,300° C., unwanted unreacted materials can remain, thereby hindering the secondary sintering, resulting in a reduction in wavelength conversion efficiency.

If the secondary sintering temperature is less than 1,000° C., the synthesis reaction may not be effectively performed, making it difficult to obtain a desired wavelength intensity under UV wavelength light. On the other hand, if the secondary sintering temperature exceeds 1,500° C., the product can melt at the high temperature, thereby producing a glass phase. Therefore, emission intensity is reduced, and it is difficult to obtain powder of desired physical properties.

The calcium-containing compound can be $CaCO_3$, $CaCl_2 \cdot 2H_2O$, or the like, and the magnesium-containing compound may be $MgO$, $MgCO_3$, or the like. Where strontium or barium is used instead of calcium, a strontium-containing compound may be $SrCO_3$, $SrCl_2 \cdot 6H_2O$, or the like, and a barium-containing compound may be $BaCO_3$, $BaCl_2$, or the like. The europium-containing compound may be $Eu_2O_3$, or the like, the manganese-containing compound may be $MnCO_3$, $MnO$, $MnCl_2 \cdot 4H_2O$, or the like, and the silicon-containing compound may be $SiO_2$, $H_2SiO_3$, tetraethyl orthosilicate ("TEOS"), or the like.

The present invention also provides a white LED including: an LED; and a phosphor of the present invention as a green phosphor.

The white LED of the present invention may further include at least one selected from a blue phosphor or a red phosphor.

Hereinafter, a method of manufacturing a white LED will be described.

First, the above-described alkaline earth metal silicate-based phosphor of Formula 1 is mixed with a blue phosphor and a red phosphor to prepare a phosphor composition.

The blue phosphor may be, in an exemplary embodiment, $BaMg_2Al_{16}O_{27}:Eu^{2+}$, $Sr_4Al_{14}O_{25}:Eu^{2+}$, $BaAl_{12}O_{19}:Eu^{2+}$, $(Sr,Mg,Ca,Ba)_5(PO_4)_3Cl:Eu^{2+}$, $Sr_2Si_3O_8 \cdot 2SrCl_2:Eu^{2+}$, or the like.

The content of the blue phosphor varies according to a desired emission area, but may be 0.1 to 15 parts by weight, specifically, 0.1 to 5 parts by weight, based on 1 part by weight of green phosphor. If the content of the blue phosphor is outside this range, compromised performance such as, for example, poor color characteristics, or the like, may result.

The red phosphor may be, in an embodiment, $Y_2O_3:Eu^{3+}$, $Bi^{3+}$; $(Sr,Ca,Ba,Mg,Zn)_2P_2O_7:Eu^{2+},Mn^{2+}$; $(Ca,Sr,Ba,Mg,Zn)_{10}(PO_4)_6(F,Cl,Br,OH)_2:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)BO_3:Eu^{3+},Bi^{3+}$; $(Gd,Y,Lu,La)(P,V)O_4:Eu^{3+},Bi^{3+}$; $(Ca,Sr)S:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_xSi_yN_z:Eu^{2+}(0.5 \leq x \leq 3.1, 5 \leq y \leq 8, 0 < z \leq 3)$, $(Sr,Ca,Ba,Mg,Zn)_2SiO_4:Eu^{2+},Mn^{2+}$, or the like.

The content of the red phosphor varies according to the desired emission area, but may be 0.1 to 15 parts by weight, specifically, 0.1 to 5 parts by weight, based on 1 part by weight of green phosphor. If the content of the red phosphor is outside this range, compromised performance such as, for example, poor color characteristics, or the like, may result.

The alkaline earth metal silicate-based phosphor of Formula 1 of the present invention is used as a green phosphor.

In the white LED, in an embodiment, the emission peak wavelength of the green phosphor may be 500 to 550 nm, the emission peak wavelength of the blue phosphor may be 440 to 460 nm, and the emission peak wavelength of the red phosphor may be 590 to 690 nm.

A white LED manufactured using the above-described phosphor composition has an excellent color reproduction index of greater than or equal to 90, and thus, can be used in an illumination apparatus for achieving good color presentation and a spectrum of light similar to natural light.

FIG. 1 is a schematic view illustrating the structure of a white LED according to an embodiment. Here, the white LED is a polymer lens type, surface mounted LED, and an epoxy lens is used as an embodiment of the polymer lens.

Referring to FIG. 1, a UV LED chip 10 is die-bonded to an electric lead line 30 via a gold wire 20, and an epoxy mold layer 50 is formed on the UV LED chip 10 using a phosphor composition 40 containing a green phosphor. A reflective film coated with aluminum or silver is formed on an inner surface of a mold 60 to reflect light upward from the UV LED chip 10 and to confine an appropriate amount of epoxy.

An epoxy dome lens 70 is formed above the epoxy mold layer 50. The shape of the epoxy dome lens 70 may be changed according to a desired orientation angle.

The white LED of the present invention is not limited to the structure illustrated in FIG. 1. For example, the white LED of the present invention may be a phosphor-mounted LED, a lamp-type LED, or a PCB-type surface-mounted LED.

Meanwhile, the alkaline earth metal silicate-based phosphor of Formula 1 of the present invention can be applied to a lamp such as a mercury lamp or a xenon lamp, or a self-emission liquid crystal display ("LCD"), in addition to an LED as described above.

Hereinafter, the present invention will be described more specifically with reference to the following examples. The following examples are for illustrative purposes only and are not intended to limit the scope of the invention.

Synthesis Example 1

Preparation of $Ca_7MgSi_4O_{16}:Eu$ $((Ca_{0.99}Eu_{0.01})_7MgSi_4O_{16})$ 30 g of $CaCO_3$, 1.74 g of $MgO$, 10.4 g of $SiO_2$, and 0.5 g of $Eu_2O_3$ were mixed. The resultant mixture was added to an alumina crucible, and the alumina crucible was placed in an electrical furnace. The mixture was heated in a reduction atmosphere (5% $H_2$ and 95% $N_2$ (v/v)) at 1,000-1300° C. for 3-10 hours. The resultant sintered product was pulverized into powder, and the powder was washed with distilled water, to give a phosphor, $Ca_7MgSi_4O_{16}:Eu$.

Figure 6A:
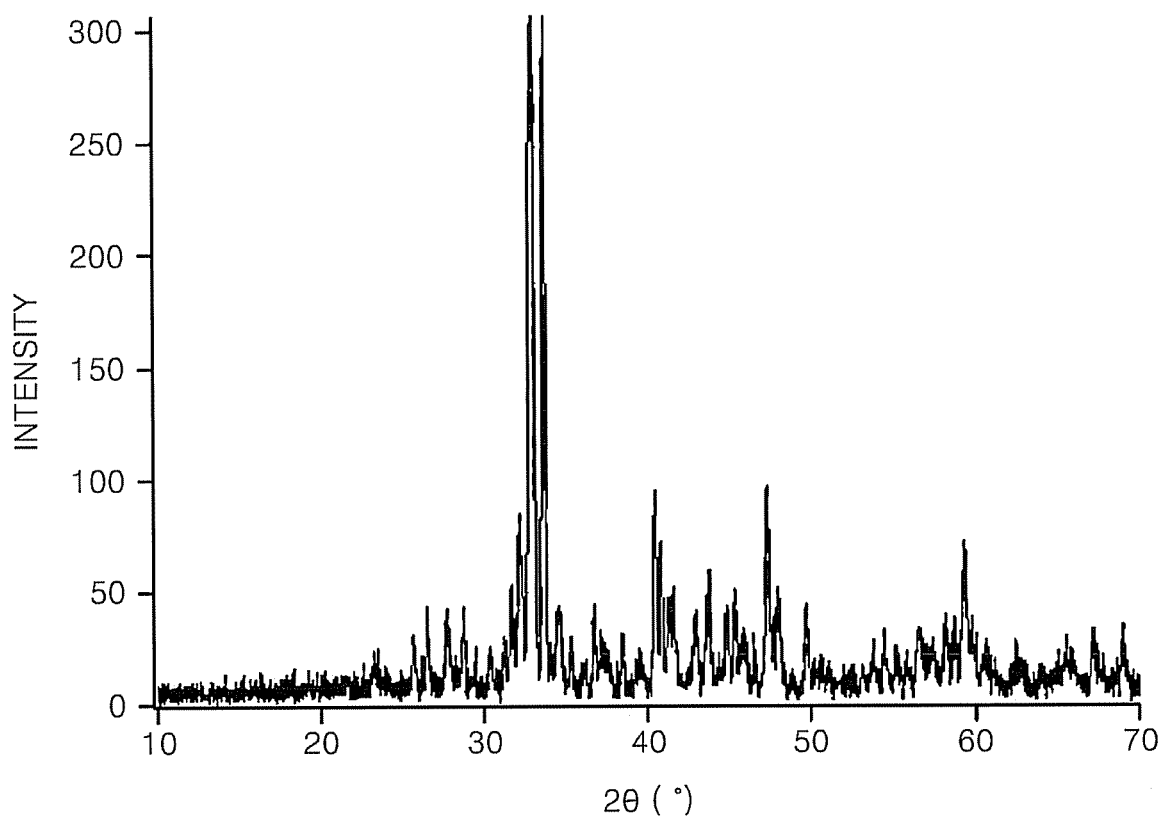
FIG. 6A illustrates an X-ray diffraction (XRD) spectrum of the exemplary phosphor prepared in Synthesis Example 1 according to the embodiment.
Figure 6B:
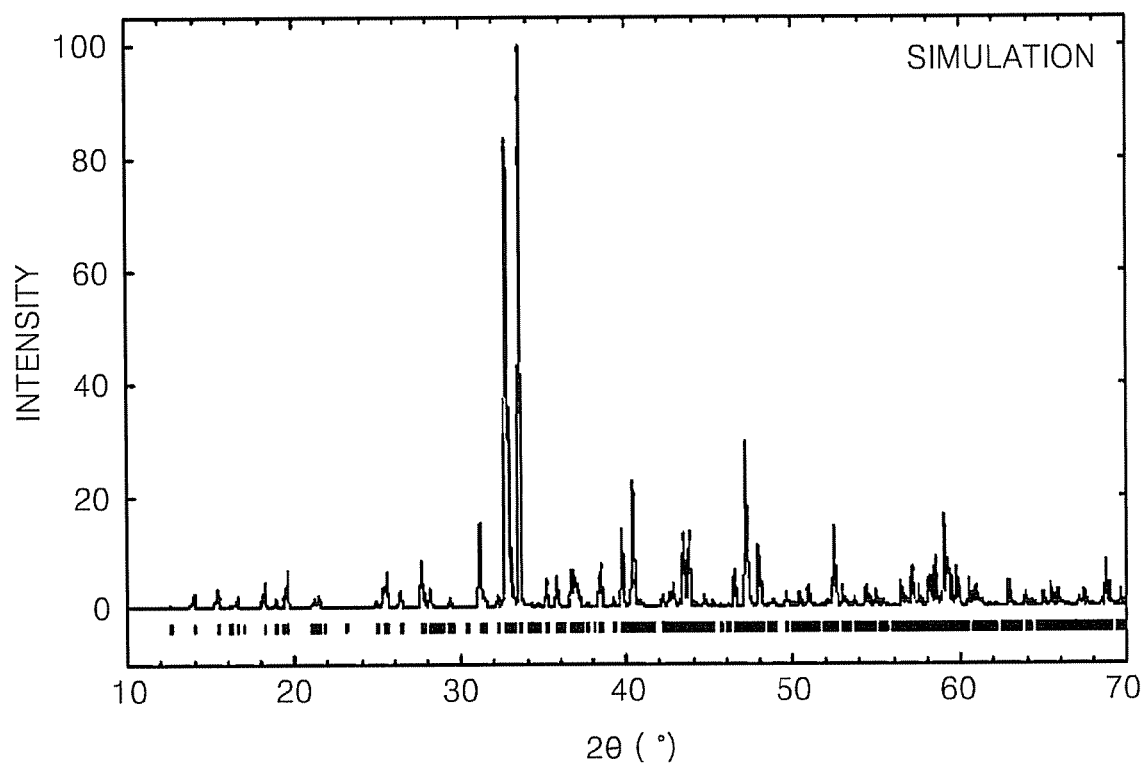
FIG. 6B illustrates the result of a simulation of the XRD spectrum of the exemplary phosphor prepared in Synthesis Example 1 according to an embodiment.

X-ray diffraction (XRD) analysis of the powder was performed, and the result is illustrated in FIG. 6A. The XRD result of FIG. 6A was compared with the simulation result of the XRD spectrum of the powder illustrated in FIG. 6B. Referring to FIGS. 6A and 6B, the XRD result of FIG. 6A is the same as the XRD simulation result of FIG. 6B. This result shows that the phosphor prepared in Synthesis Example 1 has a bredigite structure.

Figure 7:
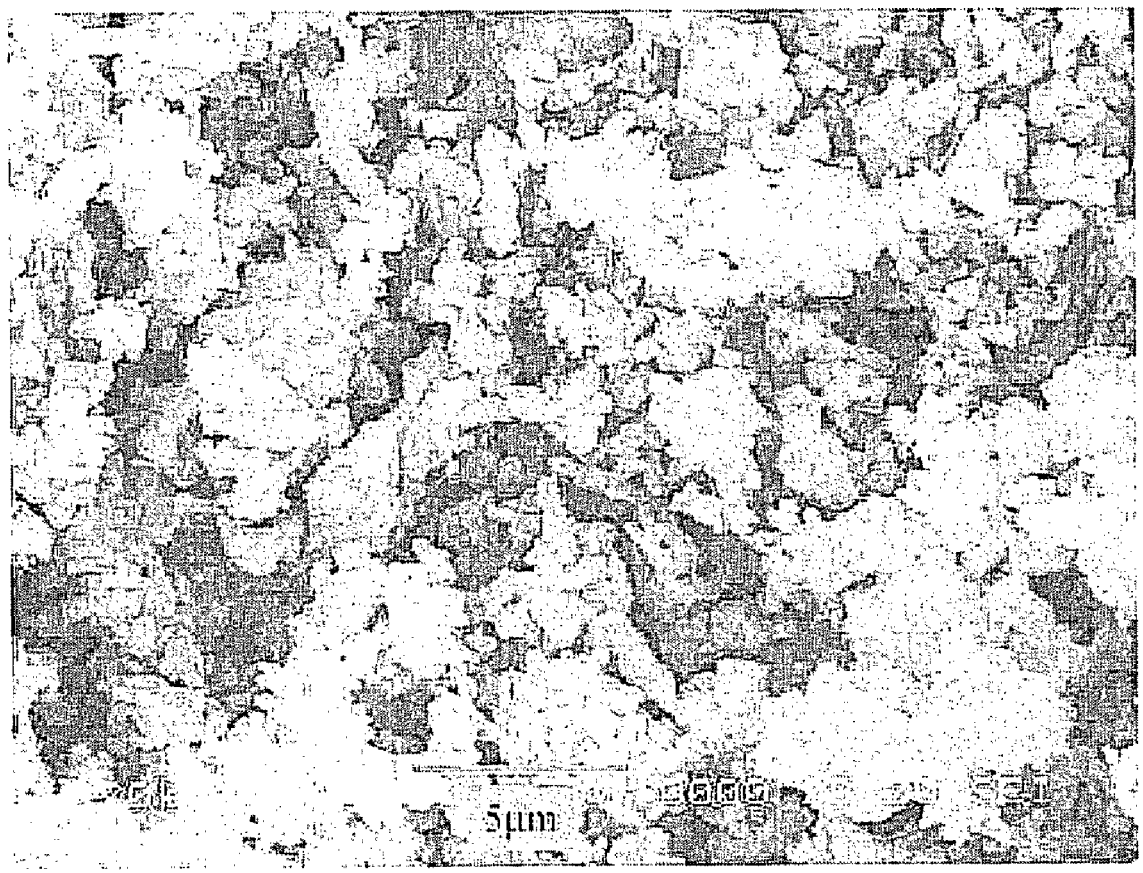
FIG. 7 is a scanning electron microscopic (SEM) image of the exemplary phosphor prepared in Synthesis Example 1 according to an embodiment.

FIG. 7 is a scanning electron microscopic ("SEM") image of the phosphor prepared in Synthesis Example 1 according to the present invention.

Synthesis Example 2

Preparation of $Ca_7MgSi_4O_{16}:Eu,Mn$ $((Ca_{0.99}Eu_{0.01})_7(Mg_{0.9}Mn_{0.1})Si_4O_{16})$ 35 g of $CaCO_3$, 1.8 g of $MgO$, 12.1 g of $SiO_2$, 0.6 g of $Eu_2O_3$, and 0.6 g of $MnCO_3$ were mixed. The resultant mixture was added to an alumina crucible, and the alumina crucible was placed in an electrical furnace. The mixture was heated in a reduction atmosphere (5% $H_2$ and 95% $N_2$ (v/v)) at a temperature of 1,000-1,300° C. for 3-10 hours. The resultant sintered product was pulverized into powder, and the powder was washed with distilled water, to give a phosphor, $Ca_7MgSi_4O_{16}:Eu,Mn$.

Figure 4:
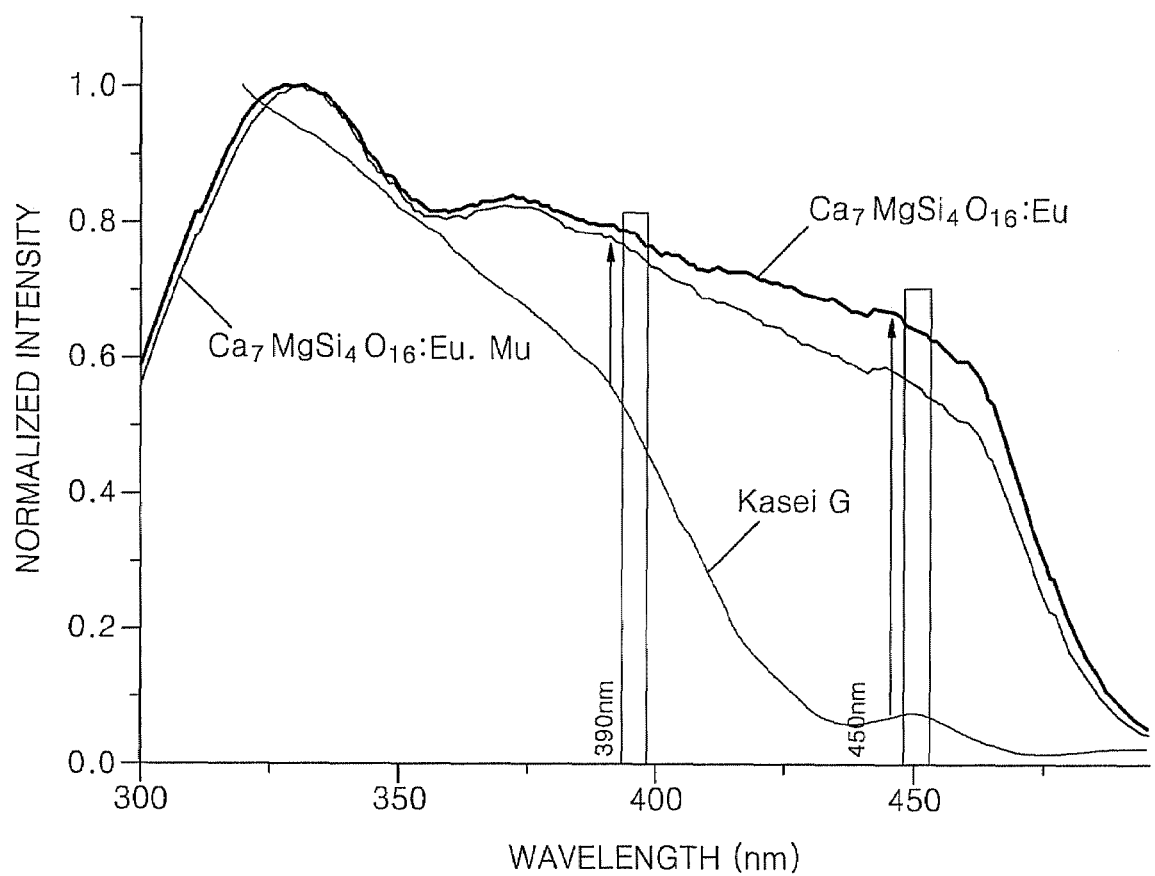
FIG. 4 illustrates absorption spectra of exemplary phosphors prepared in Synthesis Examples 1 and 2 according to an embodiment.

Absorption spectra of the phosphors prepared in Synthesis Examples 1 and 2 were measured, and the results are illustrated in FIG. 4.

Referring to FIG. 4, the phosphors prepared in Synthesis Examples 1 and 2 exhibited high absorption characteristics at a wavelength of about 390-450 nm, as compared to $BaMgAl_{10}O_{17}:Eu,Mn$.

Figure 5:
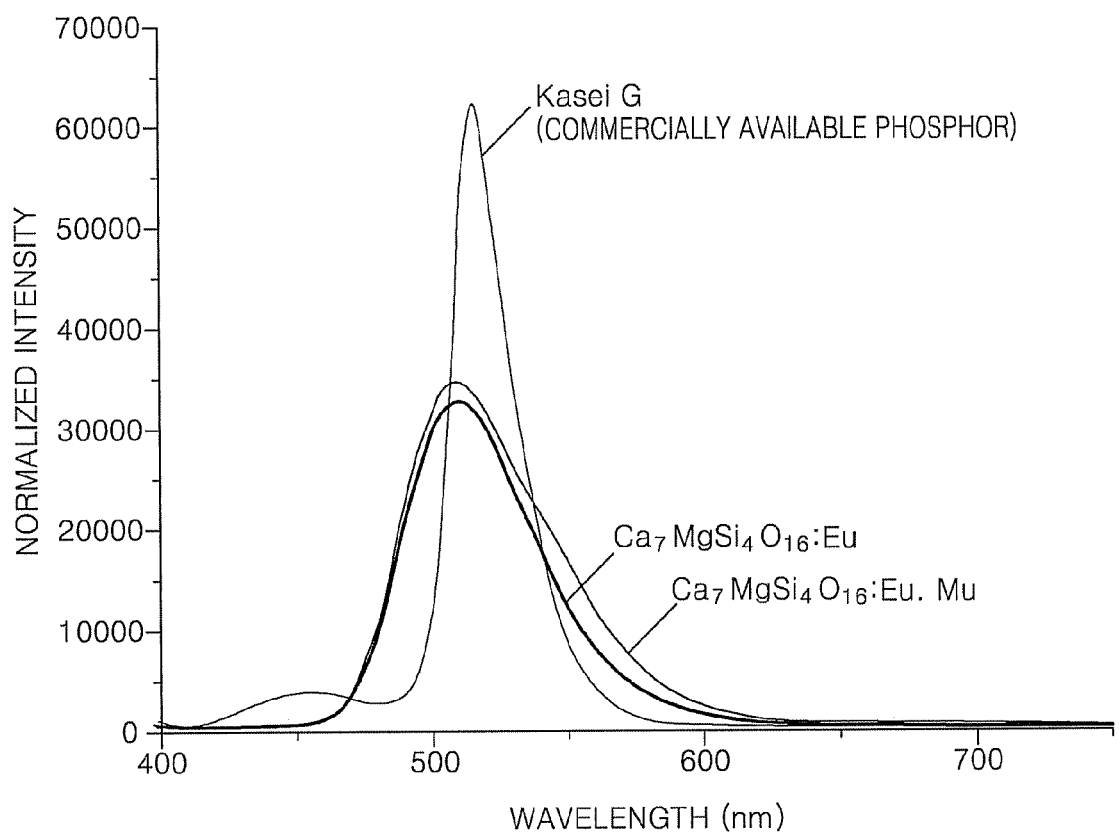
FIG. 5 illustrates emission spectra of the exemplary phosphors prepared in Synthesis Examples 1 and 2 according to an embodiment.

Emission spectra of the phosphors prepared in Synthesis Examples 1 and 2 were measured, and the results are illustrated in FIG. 5.

FIG. 5 illustrates emission spectra measured at an excitation wavelength of about 390 nm. Referring to FIG. 5, emission spectra of a broad wavelength range from about 430 to 610 nm were observed. This shows that the phosphors prepared in Synthesis Examples 1 and 2 are useful for producing a spectrum of light similar to natural light. Furthermore, the phosphors prepared in Synthesis Examples 1 and 2 had emission spectra of a broad wavelength range as compared to commercially available green phosphor (KX-671, manufactured by Kasei. Ltd.). The integrated area of the emission spectrum curve of the phosphor ($Ca_7MgSi_4O_{16}$:Eu,Mn) prepared in Synthesis Example 2 was 112% of that of the green phosphor (KX-671, manufactured by Kasei. Ltd.), thereby achieving a high emission intensity. These results show that the phosphors prepared in Synthesis Examples 1 and 2 are suitable for practical use as phosphors for white LEDs.

Example 1

Manufacturing of White LEDs

White LEDs as illustrated in FIG. 1 were manufactured using the phosphor prepared in Synthesis Example 1 as a green phosphor (activator: $Eu^{2+}$), $Y_2O_3$:Eu,Bi as a red phosphor, $(Sr,Ba,Ca)_5(PO_4)_3Cl$:Eu as a blue phosphor, and a UV LED (emission wavelength: about 390 nm) as an excitation light source.

An alkaline earth metal silicate-based phosphor of Formula 1 of the present invention has a broad excitation wavelength range, and thus, both a UV-LED and a blue LED can be used as excitation sources for white LEDs. Furthermore, the total emission area of an emission spectrum of the alkaline earth metal silicate-based phosphor is greater than that of a conventional phosphor, thereby achieving better emission efficiency.

What is claimed is:

1. An alkaline earth metal silicate-based phosphor comprising a compound represented by Formula 1 below:

$$(M1_{1-x-y}A_xB_y)_aMg_bM2_cO_dZ_e \quad \text{Formula 1}$$

wherein,

M1 is one selected from the group consisting of Ba, Ca, and Sr;

M2 is at least one selected from Si or Ge;

A and B are each independently one selected from the group consisting of Eu, Ce, Mn, Pr, Nd, Sm, Gd, Tb, Dy, Ho, Er, Tm, Yb, Bi, Sn, and Sb;

Z is at least one selected from the group consisting of a monovalent or divalent element, H, and N; and 0<x<1, 0≦y≦1, 6.3<a<7.7, 0.9<b<1.1, 3.6<c<4.4, 14.4<d<17.6, 14.4<d+e<17.6, and 0≦e≦0.18.

2. The alkaline earth metal silicate-based phosphor of claim 1, which has a bredigite structure.

3. The alkaline earth metal silicate-based phosphor of claim 1, comprising a compound represented by Formula 2 below:

$$(M1_{1-x-y}A_xB_y)_aMg_bM2_cO_d \quad \text{Formula 2}$$

wherein,

M1 is one selected from the group consisting of Ba, Ca, and Sr;

M2 is at least one selected from Si or Ge;

A and B are each independently Eu or Mn; and

0<x<1, 0≦y≦1, 6.3<a<7.7, 0.9<b<1.1, 3.6<c<4.4, and 14.4<d<17.6.

4. The alkaline earth metal silicate-based phosphor of claim 3, comprising $(Ca_{0.99}Eu_{0.01})_7MgSi_4O_{16}$ or $(Ca_{0.96}Eu_{0.01}Mn_{0.03})_7MgSi_4O_{16}$.

5. A white light-emitting device (LED) comprising:
a UV LED;
the alkaline earth metal silicate-based phosphor of claim 1 as a green phosphor;
a blue phosphor; and
a red phosphor.

6. The white LED of claim 5, wherein the emission wavelength of the UV LED ranges from 390 to 460 nm.

7. The white LED of claim 5, wherein the blue phosphor is at least one selected from the group consisting of $BaMg_2Al_{16}O_{27}$:$Eu^{2+}$, $Sr_4Al_{14}O_{25}$:$Eu^{2+}$, $BaAl_{12}O_{19}$:$Eu^{2+}$, $(Sr,Mg,Ca,Ba)_5(PO_4)_3Cl$:$Eu^{2+}$, and $Sr_2Si_3O_8 \cdot 2SrCl_2$:$Eu^{2+}$.

8. The white LED of claim 5, wherein the red phosphor is at least one selected from the group consisting of $Y_2O_3$:$Eu^{3+}$, $Bi^{3+}$ $(Sr,Ca,Ba,Mg,Zn)_2P_2O_7$:$Eu^{2+}$,$Mn^{2+}$; $(Ca,Sr,Ba,Mg,Zn)_{10}(PO_4)_6(F,Cl,Br,OH)_2$:$Eu^{2+}$,$Mn^{2+}$; $(Gd,Y,Lu,La)_2O_3$:$Eu^{3+}$,$Bi^{3+}$; $(Gd,Y,Lu,La)_2O_2S$:$Eu^{3+}$,$Bi^{3+}$; $(Gd,Y,Lu,La)BO_3$:$Eu^{3+}$,$Bi^{3+}$; $(Gd,Y,Lu,La)(P,V)O_4$:$Eu^{3+}$,$Bi^{3+}$; $(Ca,Sr)S$:$Eu^{2+}$; $CaLa_2S_4$:$Ce^{3+}$; $(Ba,Sr,Ca)MgP_2O_7$:$Eu^{2+}$,$Mn^{2+}$; $(Y,Lu)_2WO_6$:$Eu^{3+}$,$Mo^{6+}$; $(Ba,Sr,Ca)_xSi_yN_z$:$Eu^{2+}$(0.5≦x≦3.1, 5≦y≦8, 0<z≦3), and $(Sr,Ca,Ba,Mg,Zn)_2SiO_4$:$Eu^{2+}$,$Mn^{2+}$.

9. The white LED of claim 5, wherein the emission peak wavelength of the green phosphor is 500 to 550 nm, the emission peak wavelength of the blue phosphor is 440 to 460 nm, and the emission peak wavelength of the red phosphor is 590 to 690 nm.

10. A method of preparing $(Ca,Sr,Ba)_7Mg(Si_4O_{16})$:Eu,Mn according to a solid state method comprising:
mixing at least one compound selected from a calcium-containing compound, a strontium-containing compound, or a barium-containing compound; a magnesium-containing compound; a europium-containing compound; a manganese-containing compound; and a silicon-containing compound, in a stoichiometric amount,
primarily sintering the mixture at 800 to 1,300° C., and
secondarily sintering the primarily sintered mixture in a mixed gas atmosphere of hydrogen and nitrogen at 1,000 to 1,500° C.

11. The method of claim 10, wherein the content of the hydrogen in the mixed gas atmosphere is at least 5 volume % based on the total volume of hydrogen and nitrogen.

12. The method of claim 10, wherein the calcium-containing compound is $CaCO_3$ or $CaCl_2 \cdot 2H_2O$, and the magnesium-containing compound is MgO or $MgCO_3$, or where strontium or barium are used instead of calcium, the strontium-containing compound is $SrCO_3$ or $SrCl_2 \cdot 6H_2O$, and the barium-containing compound is $BaCO_3$ or $BaCl_2$.

13. The method of claim 10, wherein the europium-containing compound is $Eu_2O_3$; the manganese-containing compound is $MnCO_3$, MnO, or $MnCl_2 \cdot 4H_2O$; and the silicon-containing compound is $SiO_2$, $H_2SiO_3$, or TEOS.

14. The method of claim 10, wherein $Ca_7MgSi_4O_{16}$:Eu,Mn is prepared according to the solid state method.

15. A phosphor prepared according to the method of claim 10.

* * * * *